(12) United States Patent
Kanaya

(10) Patent No.: US 12,261,154 B2
(45) Date of Patent: Mar. 25, 2025

(54) DISPLAY DEVICE WITH A METAL LAYER OVER AN INSULATING LAYER

(71) Applicant: Japan Display Inc., Tokyo (JP)

(72) Inventor: Yasuhiro Kanaya, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 482 days.

(21) Appl. No.: 17/667,552

(22) Filed: Feb. 9, 2022

(65) Prior Publication Data

US 2022/0158065 A1 May 19, 2022

Related U.S. Application Data

(63) Continuation of application No. PCT/JP2020/028898, filed on Jul. 28, 2020.

(30) Foreign Application Priority Data

Aug. 29, 2019 (JP) ................................. 2019-156648

(51) Int. Cl.
*H01L 25/075* (2006.01)
*H01L 33/62* (2010.01)

(52) U.S. Cl.
CPC .......... *H01L 25/0753* (2013.01); *H01L 33/62* (2013.01); *H01L 25/075* (2013.01)

(58) Field of Classification Search
CPC ... H01L 33/62; H01L 25/0753; H01L 27/156; H01L 33/382; H01L 25/075; H01L 33/00
See application file for complete search history.

(56) References Cited

U.S. PATENT DOCUMENTS

| 8,791,474 | B1 | 7/2014 | Bibl et al. |
| 9,252,375 | B2 | 2/2016 | Bibl et al. |
| 2012/0305950 | A1* | 12/2012 | Shikina ................ H10K 59/879 257/40 |
| 2014/0267683 | A1 | 9/2014 | Bibl et al. |
| 2017/0062674 | A1 | 3/2017 | Kwon et al. |
| 2017/0242549 | A1 | 8/2017 | Lim et al. |
| 2017/0288102 | A1 | 10/2017 | Farrens et al. |
| 2017/0358503 | A1* | 12/2017 | Liu ......................... H01L 33/38 |
| 2018/0053917 | A1* | 2/2018 | Isaka ..................... H10K 59/50 |
| 2019/0229170 | A1* | 7/2019 | Tsai .................... H10K 59/8051 |
| 2022/0246594 | A1* | 8/2022 | Shimizu ................ H01L 25/167 |

FOREIGN PATENT DOCUMENTS

JP 2016-512347 A 4/2016
WO WO-2014149864 A1 * 9/2014 .......... G09G 3/2003

OTHER PUBLICATIONS

English translation of Office Action issued on Sep. 18, 2023, in corresponding Chinese patent Application No. 202080056696.3, 8 pages.
International Search Report and Written Opinion mailed on Sep. 15, 2020, received for PCT Application PCT/JP2020/028898, Filed on Jul. 28, 2020, 14 pages including English Translation.

* cited by examiner

*Primary Examiner* — Ratisha Mehta
*Assistant Examiner* — Brad A Knudson
(74) *Attorney, Agent, or Firm* — XSENSUS LLP

(57) ABSTRACT

A display device includes a substrate, an organic insulating layer over the substrate, a metal layer over the organic insulating layer, and a light emitting element over the metal layer. The organic insulating layer includes a convex portion that overlaps the light emitting element. The metal layer covers the convex portion and includes a step portion along a side surface of the convex portion.

5 Claims, 9 Drawing Sheets

11

DISPLAY DEVICE WITH A METAL LAYER OVER AN INSULATING LAYER

CROSS REFERENCE TO RELATED APPLICATIONS

The present application is a continuation application of International Patent Application No. PCT/JP2020/028898, filed Jul. 28, 2020, which claims priority to Japanese Patent Application No. 2019-156648, filed Aug. 29, 2019. The contents of these applications are incorporated herein by reference in their entirety.

BACKGROUND OF THE INVENTION

Field

One embodiment of the present invention relates to a display device, particularly a display device using a micro LED.

Description of the Related Art

In a small or medium-sized display device such as a smart phone, a display using liquid crystals or OLEDs (Organic Light Emitting Diodes) has been commercialized. In particular, an OLED display device using the OLEDs which are self-light emitting elements has the advantages of high-contrast and does not require a backlight, as compared with a liquid crystal display device. However, since the OLEDs are composed of organic compounds, it is difficult to secure high reliability of the OLED display device due to deterioration of the organic compounds.

On the other hand, a so-called micro LED display in which pixels are arranged in a matrix and minute micro LEDs are arranged in each of the pixels has been developed as a next-generation display. The micro LEDs are self-emitting elements similar to the OLEDs, but unlike OLEDs, the micro LEDs are composed of inorganic compounds containing gallium (Ga) or indium (In). Therefore, it is easier to ensure a highly reliable micro LED display as compared with the OLED display. In addition, micro LEDs have high light emission efficiency and high brightness. Therefore, the micro LED display is expected to be the next generation display with high reliability, high brightness, and high contrast.

Similar to common LEDs, the micro LEDs are formed over a substrate such as sapphire, and are separated into individual micro LEDs by dicing the substrate. As described above, in the micro LED display, the diced micro LEDs are transferred and bonded in the pixels of a display substrate (For example, U.S. Patent Application Publication No. 2017/0288102).

BRIEF SUMMARY OF THE INVENTION

A display device according to an embodiment of the present invention includes a substrate, an organic insulating layer over the substrate, a metal layer over the organic insulating layer, and a light emitting element over the metal layer. The organic insulating layer includes a convex portion that overlaps the light emitting element. The metal layer covers the convex portion and includes a step portion along a side surface of the convex portion.

A display device according to an embodiment of the present invention includes a substrate, an organic insulating layer over the substrate, a metal layer over the organic insulating layer, and a light emitting element over the metal layer. The organic insulating layer includes a recessed portion that overlaps the light emitting element. The metal layer covers the recessed portion and includes a step portion along a side surface of the recessed portion.

A display device according to an embodiment of the present invention includes a substrate, an organic insulating layer over the substrate, an inorganic insulating layer having a predetermined pattern over the organic insulating layer, a metal layer over the inorganic insulating layer, and a light emitting element over the metal layer. The inorganic insulating layer overlaps the light emitting element. The metal layer covers the inorganic insulating layer and includes a step portion along a side surface of the inorganic insulating layer.

DESCRIPTION OF EMBODIMENTS

Figure 1:
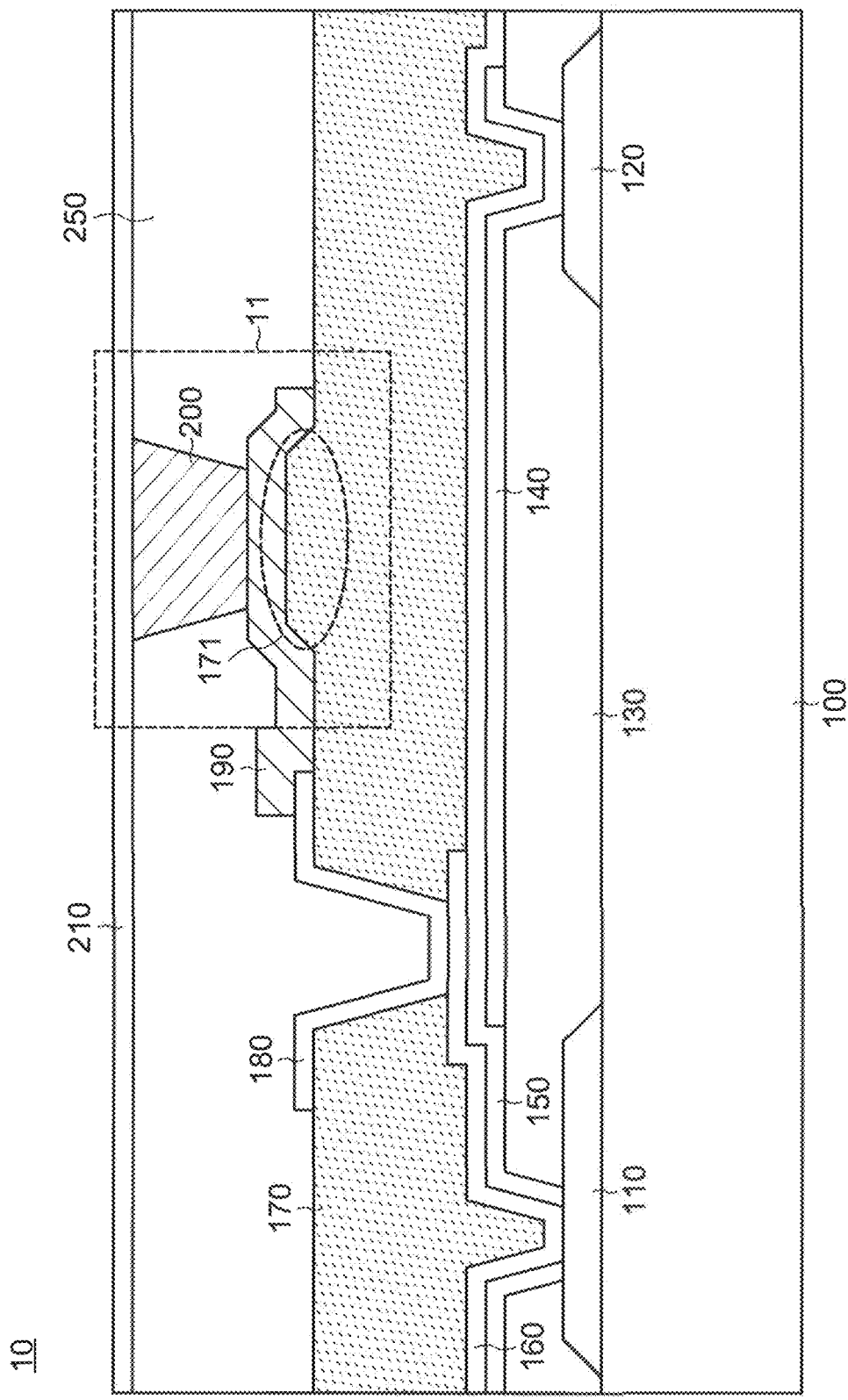
FIG. 1 is a schematic cross-sectional view of a display device according to an embodiment of the present invention.

When the adhesion between the metal layer to which the micro LED is bonded and the organic insulating layer below the metal layer is small, the metal layer may be peeled off at the interface between the metal layer and the organic insulating layer in the heat treatment at the time of bonding.

In view of the above problems, one object of an embodiment of the present invention is to relax the stress of the metal layer to which the light emitting layer of the display device is bonded and suppress peeling at the interface between the metal layer and the organic insulating layer in contact with the metal layer. Further, one object of an embodiment of the present invention is to improve the reliability of the display device.

Hereinafter, embodiments of the present invention are described with reference to the drawings. Each of the embodiments is merely an example, and a person skilled in the art could easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

In the present specification, the expressions "α includes A, B or C", "α includes any of A, B and C", and "α includes one selected from the group consisting of A, B and C" do not exclude the case where α includes a plurality of combinations of A to C unless otherwise specified. Further, these expressions do not exclude the case where α includes other elements.

In the present specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the direction from the structure to the substrate is referred to as "below" or "below direction". Therefore, in the expression of a light emitting element over a substrate, one surface of the light emitting element in the direction facing the substrate is the bottom surface of the light emitting element and the other surface is the upper surface of the light emitting element. In addition, the expression of a light emitting element over a substrate only explains the vertical relationship between the substrate and the light emitting element, and another member may be placed between the substrate and the light emitting element. Furthermore, the terms "above" or "above direction" or "below" or "below direction" mean the order of stacked layers in the structure in which a plurality of layers are stacked, and may not be related to the position in which layers overlap in a plan view.

In this specification, "display device" is intended to include a wide range of devices that display a still image or moving images using the light emitting element, and may include not only a display panel and a display module but also a device to which other optical members (for example, a polarizing member or touch panel, etc.) are attached.

The following embodiments can be combined with each other as long as there is no technical contradiction.

First Embodiment

A display device 10 according to an embodiment of the present invention is described with reference to FIGS. 1, 2A, and 2B.

[Configuration of Display Device 10]

FIG. 1 is a schematic cross-sectional view of a display device 10 according to an embodiment of the present invention. Specifically, FIG. 1 is a cross-sectional view cut so as to include pixels of the display device 10.

As shown in FIG. 1, the display device 10 includes a substrate 100, a first wiring layer 110, a second wiring layer 120, a first insulating layer 130, a second conductive layer 140, a second insulating layer 150, a first conductive layer 160, an organic insulating layer 170, a first connection electrode 180, a metal layer 190, a light emitting element 200, a flattening layer 250, and a second connection electrode 210.

The first wiring layer 110 and the second wiring layer 120 are provided on the substrate 100. The first insulating layer 130, the second conductive layer 140, the second insulating layer 150, and the first conductive layer 160 are stacked in this order over the first wiring layer 110 and the second wiring layer 120. Over the first wiring layer 110, the first insulating layer 130 and the second insulating layer 150 are opened, and the first conductive layer 160 is electrically connected to the first wiring layer 110 through the openings of the first insulating layer 130 and the second insulating layer 150. Further, over the second wiring layer 120, the first insulating layer 130 is opened, and the second conductive layer 140 is electrically connected to the second wiring layer 120 through the opening of the first insulating layer 130.

In addition, the organic insulating layer 170 including an opening is provided over the second insulating layer 150 and the first conductive layer 160. A first connection electrode 180 is provided in the opening of the organic insulating layer 170, and the first connection electrode 180 is electrically connected to the first conductive layer 160 through the opening of the organic insulating layer 170. A metal layer 190 is provided on the first connection electrode 180, and the metal layer 190 is electrically connected to the first connection electrode 180. A light emitting element 200 is provided on the metal layer 190. A second connection electrode 210 is provided on the light emitting element 200. The space between the organic insulating layer 170 and the second connection electrode 210 may be filled with an organic resin for the flattening layer 250.

The substrate 100 can support each layer over the substrate 100. For example, a flexible substrate such as a polyimide substrate, an acrylic substrate, a siloxane substrate, a fluororesin substrate, or the like can be used as the substrate 100. Impurities may be introduced into the above flexible substrate in order to improve the heat resistance of the substrate 100. If the substrate 100 is not required to be transparent, impurities that reduce the transparency of the substrate 100 can be used. On the other hand, when the substrate 100 is not required to have flexibility, a rigid substrate having transparency such as a glass substrate, a quartz substrate, or a sapphire substrate can be used as the substrate 100. Further, a substrate having no transparency such as a silicon substrate, a silicon carbide substrate, a semiconductor substrate such as a compound semiconductor substrate, or a conductive substrate such as a stainless steel substrate can be used as the substrate 100. Furthermore, a substrate on which a silicon oxide film or a silicon nitride film is formed can also be used as the substrate 100.

A metal material can be used for each of the first wiring layer 110, the second wiring layer 120, the first conductive layer 160, the second conductive layer 140, and the first connection electrode 180. Although the metal material is, for example, copper (Cu), aluminum (Al), titanium (Tic), chromium (Cr), cobalt (Co), nickel (Ni), molybdenum (Mo), hafnium (Hf), tantalum (Ta), tungsten (W), bismuth (Bi), and alloys or compounds thereof, the metal material is not limited to these. Further, the first wiring layer 110, the second wiring layer 120, the first conductive layer 160, the second conductive layer 140, or the first connection electrode 180 may have a structure in which the above metal materials are stacked.

An insulating material can be used for each of the first insulating layer 130 and the second insulating layer 150. Although the insulating material is, for example, an inorganic insulating material such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), or the like, the insulating material is not limited to these. Here, $SiO_xN_y$ and $AlO_xN_y$ are silicon compounds and aluminum compounds containing nitrogen in an amount smaller than oxygen. Further, $SiN_xO_y$ and $AlN_xO_y$ are silicon compounds and aluminum compounds containing oxygen in an amount smaller than nitrogen. In addition, not only the above inorganic insulating material but also an organic insulating material can be used for each of the first insulating layer 130 and the second insulating layer 140. Although the organic insulating material is, for example, a resin such as a polyimide resin, an acrylic resin, an epoxy resin, a silicone resin, a fluororesin, a siloxane resin, or the like, the organic insulating material is not limited to these. Further, the first insulating layer 130 and the second insulating layer 140 may have a structure in which the inorganic material or the organic material may be used alone or stacked.

The organic insulating layer 170 can flatten a step of the layer below the organic insulating layer 170. A photosensitive organic material such as a photosensitive acrylic resin or a photosensitive polyimide resin can be used as a material of the organic insulating layer 170. Further, the material of the organic insulating layer 170 may be the inorganic insulating material used for the first insulating layer 130 and the second insulating layer 150. Furthermore, the organic insulating layer 170 may have a stacked structure. For example, the organic insulating layer 170 may have a stacked structure of the photosensitive organic material and the inorganic insulating material, or may have a stacked structure of the organic insulating material and the inorganic insulating material.

A convex portion 171 is provided on an upper surface of the organic insulating layer 170. For example, the height of the convex portion 171 (the distance from the upper surface of a portion of the organic insulating layer 170 where the convex portion 171 is not provided (hereinafter, simply referred to as the upper surface of the organic insulating layer 170) to an upper surface of the convex portion 171) is greater than or equal to 0.2 µm and less than or equal to 10.0 µm. The height of the organic insulating layer 170 is preferably greater than or equal to ½ of the thickness of the metal layer 190, more preferably a height larger than the thickness of the metal layer 190.

A side surface of the convex portion 171 may have a taper. That is, the side surface of the convex portion 171 does not have to be perpendicular to the upper surface of the organic insulating layer 170. The angle formed by the upper surface of the organic insulating layer 170 and the side surface of the convex portion 171 is, for example, greater than or equal to 20 degrees and less than or equal to 90 degrees, preferably greater than or equal to 30 degrees and less than or equal to 80 degrees, and more preferably greater than 40 degrees and less than or equal to 70 degrees.

Further, in a plan view, the shape of the convex portion 171 can be circular, elliptical, or polygonal. It is preferable that the shape of the convex portion 171 corresponds to the shape of the light emitting element 200. For example, when the shape of the light emitting element 200 is rectangular, it is preferable that the shape of the convex portion 171 is also rectangular.

The metal layer 190 can reflect the light emitted from the light emitting element 200. Further, the metal layer 190 has conductivity to electrically connect an electrode of the light emitting element 200 and the first connection electrode 180. For example, a metal material having a high reflectance such as aluminum (Al), silver (Ag), or platinum (Pt) is preferably used as a material of the metal layer 190. Further, metal materials used for the first wiring layer 110, the second wiring layer 120, the first conductive layer 160, the second conductive layer 140, and the first connection electrode 180 can also be used as a material of the metal layer 190.

The metal layer 190 is provided so as to cover the convex portion 171 of the organic insulating layer 170. That is, the metal layer 190 is provided so as to overlap an upper surface and the side surface of the convex portion 171. The thickness of the metal layer 190 is, for example, greater than or equal to 0.2 µm and less than or equal to 3 µm, preferably greater than or equal to 0.5 nm and less than or equal to 2 µm, and more preferably greater than or equal to 0.5 µm and less than or equal to 0.75 µm. When the thickness of the metal layer 190 is small, not only does the resistance of the metal layer 190 becomes high, but it also becomes difficult to relieve the stress of the metal layer 190. Further, when the thickness of the metal layer 190 is large, it takes time to form and process the metal layer 190, so that the manufacturing tact time of the display device 10 becomes long. Therefore, the thickness of the metal layer 190 is preferably in the above range.

For example, the light emitting element 200 is a light emitting diode (LED) or a laser diode (LD). Further, the light emitting diode includes a mini LED or a micro LED.

The light emitting element 200 is provided in each pixel of the display device, and any one of a red light emitting element, a green light emitting element, and a blue light emitting element is provided in each pixel. By combining the red light emission of the red light emitting element, the green light emission of the green light emitting element, and the blue light emission of the blue light emitting element, the display device 10 for full-color display can be obtained. Further, the display device 10 for full-color display is also possible by arranging a white light emitting element as the light emitting element 200 in each pixel and extracting red light emission, green light emission, and blue light emission from the white light of the white light emitting element via a color filter. Furthermore, the display device 10 for full-color display is also possible by arranging an ultraviolet light emitting element as the light emitting element 200 in each pixel, converting ultraviolet light of the ultraviolet light emitting element via a red phosphor, a green phosphor, and a blue phosphor and extracting red light emission, green light emission, and blue light emission.

In the display device 10, the plurality of light emitting elements 200 may be arranged in a matrix, or may be arranged in a zigzag or stripe pattern.

The structure of the light emitting element 200 is not limited to a vertical electrode structure in which the electrodes are arranged in the vertical direction. A horizontal electrode structure in which the electrodes are arranged in the horizontal direction is also possible as the structure of the light emitting element 200. The light emitting element 200 shown in FIG. 1 has the vertical electrode structure, one of the electrodes of the light emitting element 200 is electrically connected to the metal layer 190, and the other of the electrodes of the light emitting element 200 is electrically connected to the second connection electrode 210.

The light emitting element 200 is provided over the metal layer 190, and the metal layer 190 and the light emitting element 200 are bonded and electrically connected to each other by a solder such as tin (Sn) or an alloy containing tin, a silver (Ag) paste, or a conductive material such as ACF.

The second connection electrode 210 can transmit light emitted from the light emitting element 200. Further, it is preferable that the second connection electrode 210 has high conductivity. For example, a transparent conductive oxide such as indium tin oxide (ITO) or indium zinc oxide (IZO) can be used as a material of the second connection electrode 210.

Next, an effect of the metal layer 190 provided on the convex portion 171 is described with reference to FIGS. 2A and 2B.

Figure 2A:
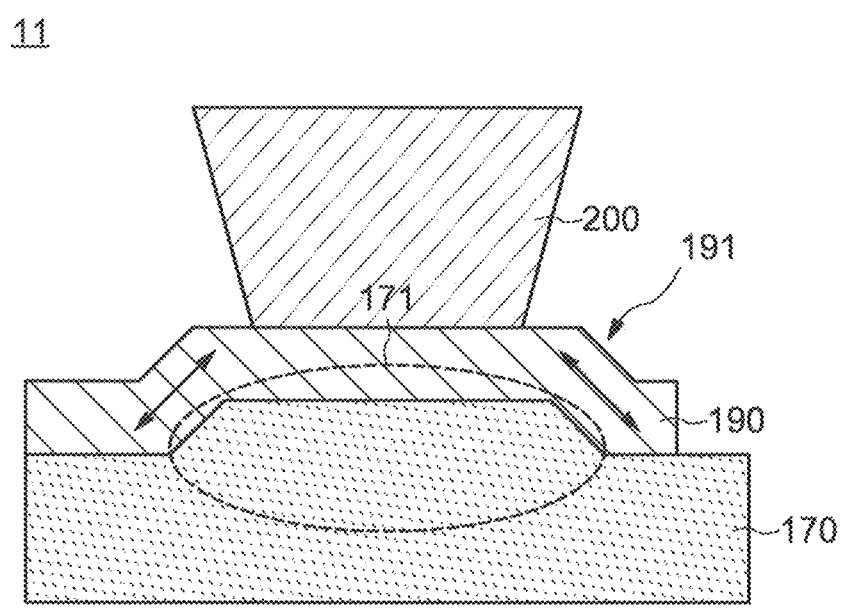
FIG. 2A is a schematic partially enlarged view of a display device according to an embodiment of the present invention.
Figure 2B:
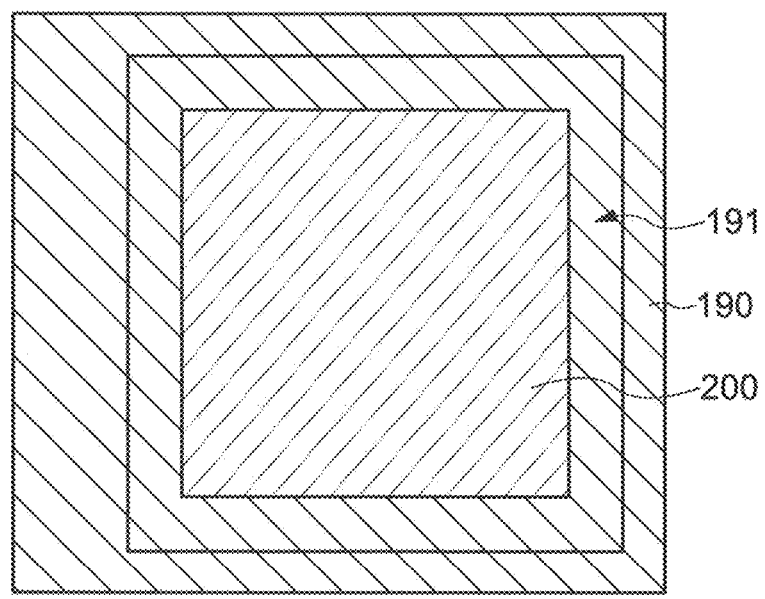
FIG. 2B is a schematic plan view of a display device according to an embodiment of the present invention.

FIGS. 2A and 2B are a schematic partially enlarged view and a schematic plan view of the display device 10 according to the embodiment of the present invention, respectively.

Specifically, FIG. 2A is an enlarged cross-sectional view of a region 11 surrounded by the broken line shown in FIG. 1. Further, FIG. 2B is a plan view corresponding to the region 11 of FIG. 2A. In FIGS. 2A and 2B, the second connection electrode 210 on the light emitting element 200 is omitted for convenience.

As shown in FIG. 2A, the metal layer 190 provided on the convex portion 171 covers not only the upper surface of the convex portion 171 but also the side surface of the convex portion 171. That is, since the metal layer 190 is provided along the side surface of the convex portion 171, the metal layer 190 includes a step 191.

Further, as shown in FIG. 2B, the step 191 of the metal layer 190 is provided so as to surround the light emitting element 200.

As described above, the metal layer 190 and the light emitting element 200 are bonded by a material such as solder, silver paste, or ACF, and a heat treatment is performed at the time of bonding. Generally, since the material of the organic insulating layer 170 and the material of the metal layer 190 have different coefficients of thermal expansion, the stress generated in the expansion or the shrinkage due to the heat treatment differs between the organic insulating layer 170 and the metal layer 190. Therefore, when the difference in stress between the organic insulating layer 170 and the metal layer 190 is large, peeling occurs at the interface between the organic insulating layer 170 and the metal layer 190.

However, in the present embodiment, the metal layer 190 includes the step 191. By including the step 191 in the metal layer 190, the stress of the metal layer 190 includes not only the horizontal component but also the vertical component, and the stress of the metal layer 190 is dispersed. In other words, it can be said that the stress of the metal layer 190 is relaxed by including the step 191 in the metal layer 190. Since the stress of the metal layer 190 is relaxed not only by the heat treatment at the time of bonding of the light emitting element 200 but also by the thermal change in the usage environment of the display device 10, the reliability of the display device 10 is improved.

As described above, in the display device 10 of the present embodiment, the metal layer 190 includes the step 191 due to the convex portion 171 provided on the organic insulating layer 170. Therefore, in the heat treatment when bonding the light emitting element 200, the stress of the metal layer 190 is relaxed, so that peeling at the interface between the metal layer 190 and the organic insulating layer 170 can be suppressed. Further, since the display device 10 is resistant to thermal changes, the reliability of the display device 10 is improved.

The display device 10 can be modified or transformed in various ways. Therefore, a display device 10A and a display device 10B, which are modifications of the display device 10, are described with reference to FIGS. 3 and 4. Further, a modification of the display device 10 is not limited to the following modification.

Modification 1

Figure 3:
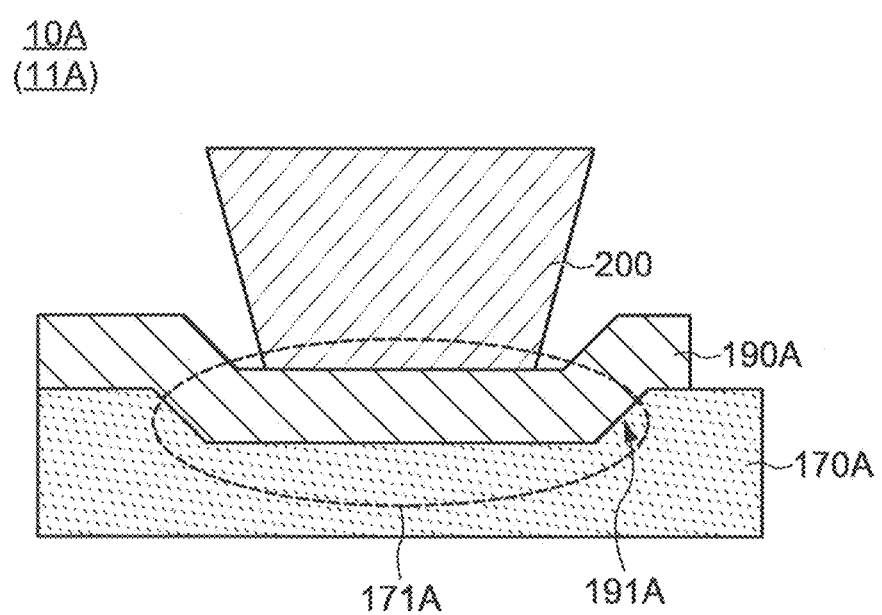
FIG. 3 is a schematic partially enlarged view of a display device according to an embodiment of the present invention.

FIG. 3 is a schematic partially enlarged view of the display device 10A according to the embodiment of the present invention. Specifically, FIG. 3 is a partially enlarged view of an area 11A of the display device 10A corresponding to the area 11 surrounded by the broken line shown in FIG. 1.

As shown in FIG. 3, the display device 10A includes an organic insulating layer 170A, a metal layer 190A, and a light emitting element 200. The organic insulating layer 170A is provided with a recessed portion 171A recessed from an upper surface of the organic insulating layer 170A. The metal layer 190A is provided so as to cover the recessed portion 171A. The light emitting element 200 is bonded to the metal layer 190A by a conductive material such as solder, silver paste, or ACF.

The depth of the recessed portion 171A (the distance from the upper surface of the organic insulating layer 170A to the bottom surface of the recessed portion 171A) is, for example, greater than or equal to 0.2 μm and less than or equal to 10 μm. Further, the depth of the recessed portion 171A is preferably greater than or equal to ½ of the thickness of the metal layer 190, more preferably a depth larger than the thickness of the metal layer 190. Further, a side surface of the recessed portion 171A may have a taper. That is, the side surface of the recessed portion 171A does not have to be perpendicular to the upper surface of the organic insulating layer 170A. The angle formed by the upper surface of the organic insulating layer 170A and the side surface of the recessed portion 171A is, for example, greater than or equal to 20 degrees and less than or equal to 90 degrees, preferably greater than or equal to 30 degrees and less than or equal to 80 degrees, and more preferably greater than or equal to 40 degrees and less than or equal to 70 degrees.

Further, in a plan view, the shape of the recessed portion 171A can be circular, elliptical, or polygonal. It is preferable that the shape of the recessed portion 171A corresponds to the shape of the light emitting element 200. For example, when the shape of the light emitting element 200 is rectangular, it is preferable that the shape of the recessed portion 171A is also rectangular.

As shown in FIG. 3, the metal layer 190A provided on the recessed portion 171A covers not only an upper surface of the recessed portion 171A but also the side surface of the recessed portion 171A. That is, since the metal layer 190A is provided along the side surface of the recessed portion 171A, the metal layer 190A includes a step 191A. Therefore, also in the display device 10A, since the metal layer 190A includes the step 191A, the stress of the metal layer 190 is relaxed in the heat treatment at the time of bonding of the light emitting element 200.

As described above, in the display device 10A of the present embodiment, the metal layer 190A includes the step 191A due to the recessed portion 171A provided on the organic insulating layer 170A. Therefore, in the heat treatment when bonding the light emitting element 200, the stress of the metal layer 190A is relaxed, so that peeling at the interface between the metal layer 190A and the organic insulating layer 170A can be suppressed. Further, since the display device 10A is resistant to thermal changes, the reliability of the display device 10A is improved.

Modification 2

Figure 4:
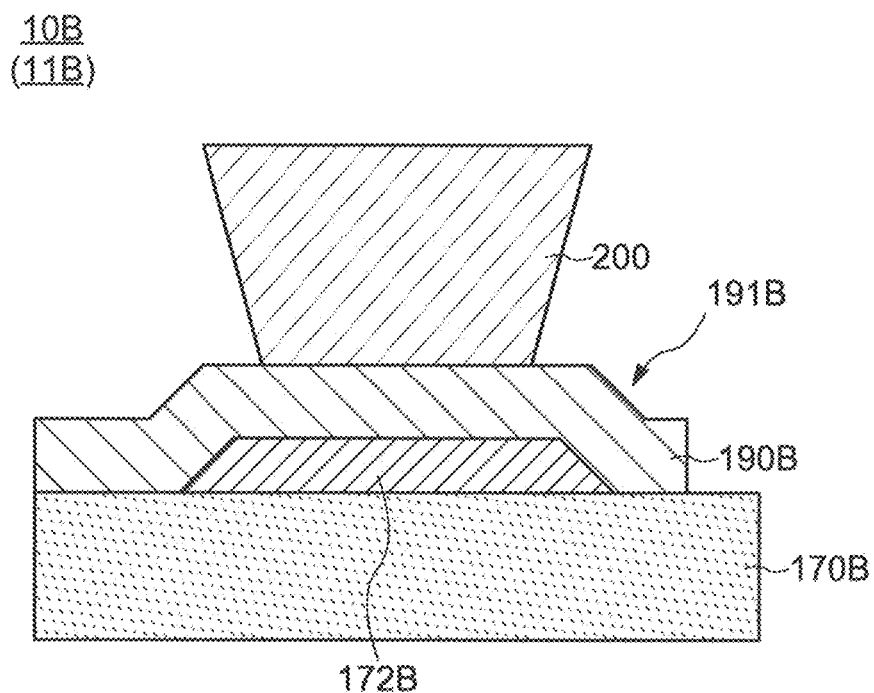
FIG. 4 is a schematic partially enlarged view of a display device according to an embodiment of the present invention.

FIG. 4 is a schematic partially enlarged view of the display device 10B according to the embodiment of the present invention. Specifically, FIG. 4 is a partially enlarged view of an area 11B of the display device 10B corresponding to the area 11 surrounded by the broken line shown in FIG. 1.

As shown in FIG. 4, the display device 10B includes an organic insulating layer 170B, an inorganic insulating layer 172B, a metal layer 190B, and a light emitting element 200. The inorganic insulating layer 172B has a predetermined pattern and is provided on the organic insulating layer 170B.

The metal layer 190B is provided so as to cover the inorganic insulating layer 172B. The light emitting element 200 is bonded to the metal layer 190B by a conductive material such as solder, silver paste, or ACF.

The thickness of the inorganic insulating layer 172B is, for example, greater than or equal to 0.2 nm and less than or equal to 10 nm, preferably greater than or equal to ½ of the thickness of the metal layer 190B, and more preferably a thickness larger than the thickness of the metal layer 190B.

A side surface of the inorganic insulating layer 172B may have a taper. That is, the side surface of the inorganic insulating layer 172B does not have to be perpendicular to an upper surface of the organic insulating layer 170B. The angle formed by the upper surface of the organic insulating layer 170B and the side surface of the inorganic insulating layer 172B is, for example, greater than or equal to 20 degrees and less than or equal to 90 degrees, preferably greater than or equal to 30 degrees and less than or equal to 80 degrees, and more preferably greater than or equal to 40 degrees and less than or equal to 70 degrees.

An insulating material can be used for the inorganic insulating layer 172B. Although the insulating material is, for example, an inorganic insulating material such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), or the like, the insulating material is not limited to these. Here, $SiO_xN_y$ and $AlO_xN_y$ are silicon compounds and aluminum compounds containing nitrogen in an amount smaller than oxygen. Further, $SiN_xO_y$ and $AlN_xO_y$ are silicon compounds and aluminum compounds containing oxygen in an amount smaller than nitrogen. Furthermore, the inorganic insulating layer 172B may be stacked with these materials.

Further, in a plan view, the inorganic insulating layer 172B has a predetermined pattern, and the shape of the pattern can be circular, elliptical, or polygonal. It is preferable that the shape of the pattern of the inorganic insulating layer 172B corresponds to the shape of the light emitting element 200. For example, when the shape of the light emitting element 200 is rectangular, it is preferable that the shape of the inorganic insulating layer 172B is also rectangular.

As shown in FIG. 4, the metal layer 190B provided on the inorganic insulating layer 172B covers not only the upper surface of the inorganic insulating layer 172B but also the side surface of the inorganic insulating layer 172B. That is, since the metal layer 190B is provided along the side surface of the inorganic insulating layer 172B, the metal layer 190B includes a step 191B. Therefore, also in the display device 10B, since the metal layer 190B includes the step 191B, the stress of the metal layer 190B is relaxed in the heat treatment at the time of bonding of the light emitting element 200.

As described above, in the display device 10B of the present embodiment, the metal layer 190B includes the step 191B due to the inorganic insulating layer 172B provided on the organic insulating layer 170B. Therefore, in the heat treatment when bonding the light emitting element 200, the stress of the metal layer 190B is relaxed, so that peeling at the interface between the metal layer 190B and the organic insulating layer 170B can be suppressed. Further, since the display device 10B is resistant to thermal changes, the reliability of the display device 10B is improved.

Second Embodiment

A display device 20 according to an embodiment of the present invention is described with reference to FIG. 5.

Figure 5:
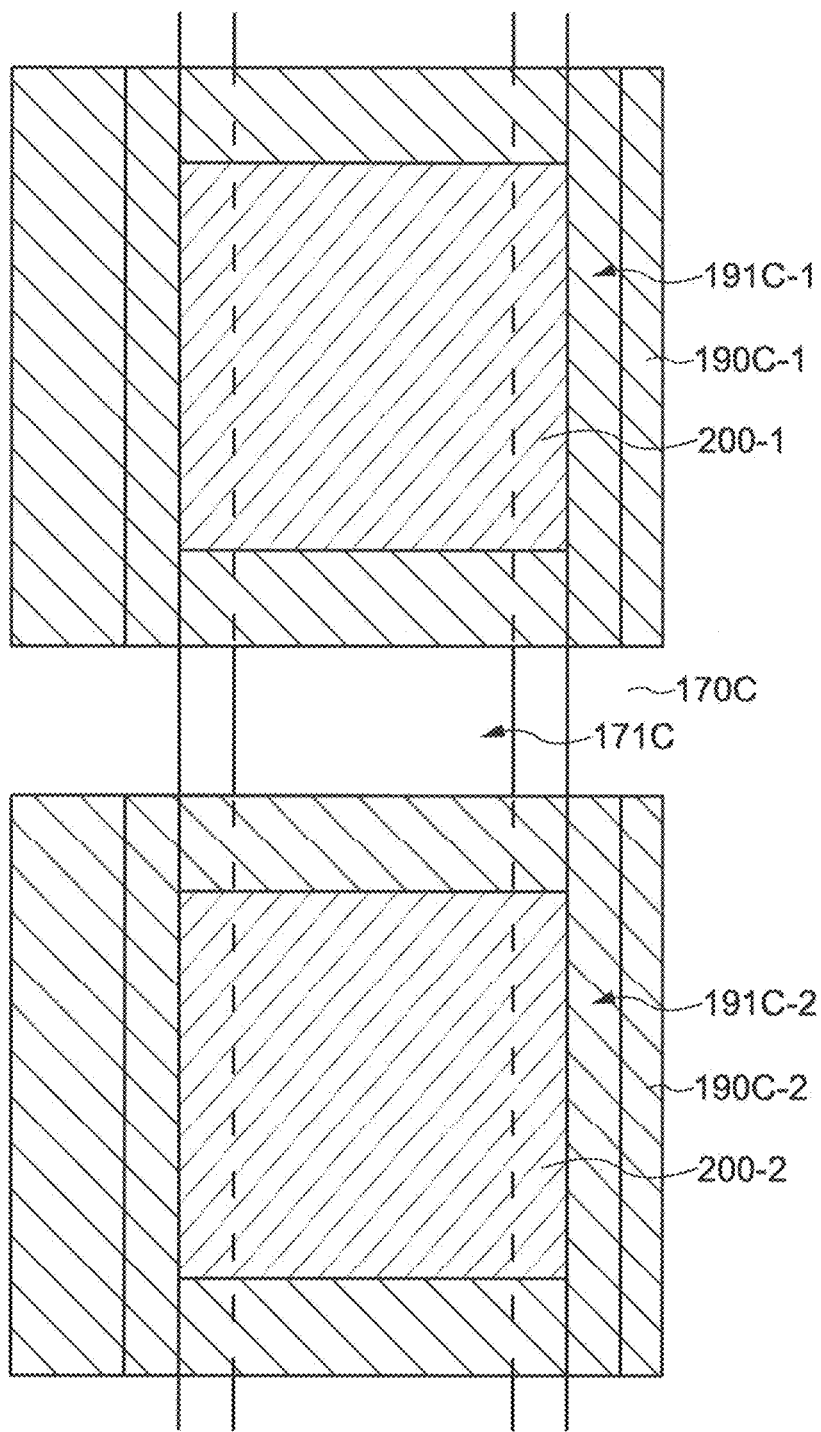
FIG. 5 is a schematic plan view of a display device according to an embodiment of the present invention.

FIG. 5 is a schematic plan view of the display device 20 according to the embodiment of the present invention. Specifically, FIG. 5 is a plan view in a region 11C including two adjacent light emitting elements 200.

As shown in FIG. 5, the display device 20 includes an organic insulating layer 170C, a first metal layer 190C-1, a second metal layer 190C-2, a first light emitting element 200-1, and a second light emitting element 200-2. On an upper surface of the organic insulating layer 170C, the convex portion 171C is provided and extended so as to overlap the two light emitting elements 200. In other words, it can be said that the convex portion 171C is provided in a stripe pattern. The first metal layer 190C-1 and the second metal layer 190C-2 are provided so as to cover the convex portion 171C. The first light emitting element 200-1 is bonded to the first metal layer 190C-1 and the second light emitting element 200-2 is bonded to the second metal layer 190C-2 by a conductive material such as solder, silver paste, or ACF.

In FIG. 5, although the convex portion 171C is extended in only one direction, the convex portion 171C may be extended in two directions. In other words, the convex portion 171C can be provided so that the two straight lines intersect in a plan view. In that case, the light emitting element 200 is provided at the intersection of the two straight lines.

As shown in FIG. 5, the first metal layer 190C-1 and the second metal layer 190C-2 provided on the convex portion 171C cover not only an upper surface of the convex portion 171C but also a side surface of the convex portion 171C. That is, since the first metal layer 190C-1 and the second metal layer 190C-2 are provided along the side surface of the convex portion 171C, the first metal layer 190C-1 and the second metal layer 190C-2 include a first step 191C-1 and a second step 191C-2, respectively. Therefore, also in the display device 20, since the first metal layer 190C-1 and the second metal layer 190C-2 include the first step 191C-1 and the second step 191C-2, respectively, the stresses of the first metal layer 190C-1 and the second metal layer 190C-2 are relaxed in the heat treatment at the time of bonding of the light emitting element 200.

As described above, in the display device 20 of the present embodiment, the first metal layer 190C-1 and the second metal layer 190C-2 include the first step 191C-1 and the second step 191C-2, respectively, due to the convex portion 171C provided and extended on the organic insulating layer 170C. Therefore, in the heat treatment when bonding the light emitting element 200, the stress of the first metal layer 190C-1 and the second metal layer 190C-2 is relaxed, so that peeling at the interface between the first metal layer 190C-1 and the organic insulating layer 170C-1 or the second insulating layer 170C-2 can be suppressed. Further, since the display device 20 is resistant to thermal changes, the reliability of the display device 20 is improved.

Third Embodiment

A method for manufacturing the display device 10 according to an embodiment of the present invention is described with reference to FIGS. 6A to 6C.

Figure 6A:
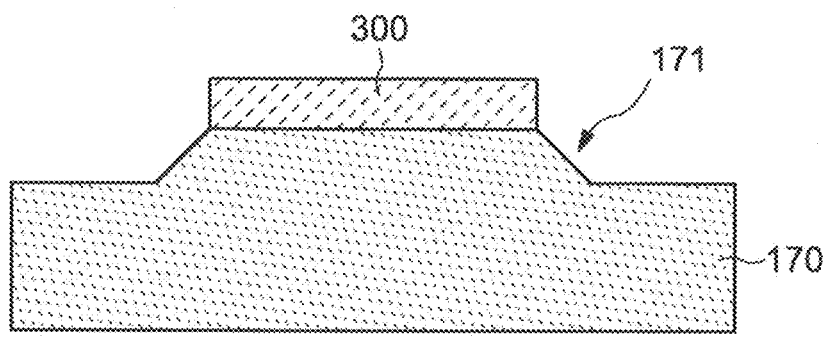
FIG. 6A is a schematic partially enlarged view of a display device according to a method for manufacturing a display device according to an embodiment of the present invention.
Figure 6B:
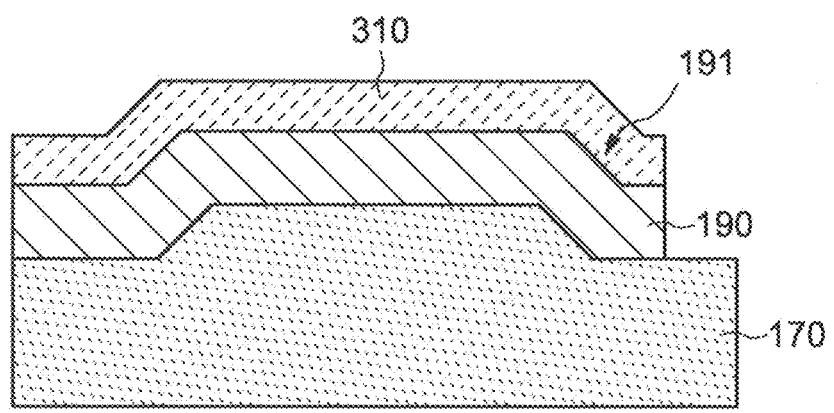
FIG. 6B is a schematic partially enlarged view of the display device in the method of manufacturing the display device according to the embodiment of the present invention.
Figure 6C:
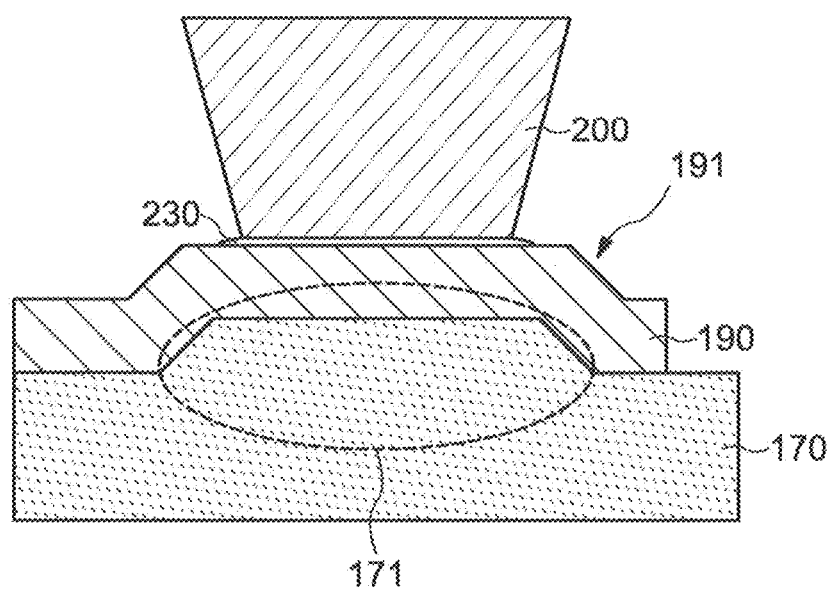
FIG. 6C is a schematic partially enlarged view of the display device in the method of manufacturing the display device according to the embodiment of the present invention.

FIGS. 6A to 6C are schematic partially enlarged views of the display device 10 in the method for manufacturing the display device 10 according to the embodiment of the present invention. Specifically, FIGS. 6A to 6C are partially enlarged views of the region 11 surrounded by the broken line shown in FIG. 1 in each step of the manufacturing method. In FIGS. 6A to 6C, the layer below the organic insulating layer 170 is omitted. The layer below the organic insulating layer 170 can be manufactured by a usual method.

First, the organic insulating layer 170 is formed. The organic insulating layer 170 can be formed by spin coating, slit coating, printing, inkjet, or the like. Next, a photoresist 300 is applied on the organic insulating layer 170 and exposed, and the organic insulating layer 170 is half-etched using the photoresist 300 as a mask (FIG. 6A). Alternatively, the photoresist 300 on the organic insulating layer 170 may be exposed as a halftone mask to etch the organic insulating layer 170. The photoresist 300 is stripped by the stripping solution. By the above method, the convex portion 171 is formed on the upper surface of the organic insulating layer 170.

Next, the metal layer 190 is formed. The metal layer 190 can be formed by sputtering, CVD, or the like. Next, the photoresist 310 is applied on the metal layer 190 and exposed, and the metal layer 190 is etched using the photoresist 310 as a mask (FIG. 6B). The photoresist 310 is stripped by the stripping solution. By the above method, a step 191 is formed on the metal layer 190 that covers the convex portion 171.

Next, a bonding material 230 such as solder, silver paste, or ACF is applied on the metal layer 190, and the light emitting element 200 is bonded (FIG. 6C). In addition, the heat treatment can be performed when the light emitting element 200 is bonded.

As described above, according to the manufacturing method of the display device 10 of the present embodiment, the metal layer 190 includes the step 191 due to the convex portion 171 provided on the organic insulating layer 170. Therefore, in the heat treatment when bonding the light emitting element 200, the stress of the metal layer 190 is relaxed, so that peeling at the interface between the metal layer 190 and the organic insulating layer 170 can be suppressed. Therefore, since the temperature of the heat treatment can be increased, the bonding strength between the metal layer 190 and the light emitting element 200 can be increased. Further, since the display device 10 is resistant to thermal changes, the reliability of the display device 10 is improved.

Each of the embodiments described above as an embodiment of the present invention can be appropriately combined and implemented as long as they do not contradict each other. Additions, deletion, or design changes of constituent elements, or additions, omissions, or changes to conditions of steps as appropriate based on the respective embodiments are also included within the scope of the present invention as long as the gist of the present invention is provided.

Other effects which differ from those brought about by each of the above described embodiments, but which are apparent from the description herein or which can be readily predicted by those skilled in the art, are naturally understood to be brought about by the present invention.

What is claimed is:

1. A display device comprising:
a substrate;
an organic insulating layer over the substrate;
a metal layer over the organic insulating layer;
a light emitting element over the metal layer;
a first connection electrode over the organic insulating layer so that a part of the first connection electrode is arranged between the organic insulating layer and the metal layer; and
a second connection electrode over the light emitting element,
wherein the organic insulating layer includes a convex portion that overlaps the light emitting element,
the metal layer covers the convex portion and includes a step portion along a side surface of the convex portion,
the light emitting element is a micro LED including a first electrode and a second electrode,
the first connection electrode is electrically connected to the first electrode through the metal layer,
the second connection electrode is electrically connected to the second electrode, and
the step portion is provided so as to surround the light emitting element in a plan view.

2. The display device according to claim 1, wherein a height of the convex portion is greater than or equal to 0.2 µm and less than or equal to 10 µm.

3. The display device according to claim 1,
wherein the side surface of the convex portion has a taper, and
an angle formed by an upper surface of the organic insulating layer and the side surface of the convex portion is greater than or equal to 20 degrees and less than or equal to 90 degrees.

4. The display device according to claim 1, wherein a shape of the convex portion is circular, elliptical, or polygonal in a plan view.

5. The display device according to claim 1, wherein the convex portion extends so as to overlap at least two of the light emitting elements.

* * * * *